(12) United States Patent
Kamiya

(10) Patent No.: US 7,554,187 B2
(45) Date of Patent: Jun. 30, 2009

(54) CONNECTING STRUCTURE, PRINTED SUBSTRATE, CIRCUIT, CIRCUIT PACKAGE AND METHOD OF FORMING CONNECTING STRUCTURE

(75) Inventor: Hiroshi Kamiya, Osaka (JP)

(73) Assignee: NEC System Technology, Ltd., Osaka-shi, Osaka (JP)

( * ) Notice: Subject to any disclaimer, the term of this patent is extended or adjusted under 35 U.S.C. 154(b) by 0 days.

(21) Appl. No.: 11/444,447

(22) Filed: Jun. 1, 2006

(65) Prior Publication Data

US 2007/0080468 A1 Apr. 12, 2007

(30) Foreign Application Priority Data

Jun. 10, 2005 (JP) .............................. 2005-171210

(51) Int. Cl.
*H01L 23/48* (2006.01)
(52) U.S. Cl. ...................................... 257/690; 257/698
(58) Field of Classification Search ................. 257/678, 257/690, 691, 700, 729
See application file for complete search history.

(56) References Cited

U.S. PATENT DOCUMENTS 7,012,339 B2 * 3/2006 Terui ........................... 257/786

2003/0199121 A1* 10/2003 Caletka et al. .............. 438/113
2004/0079193 A1* 4/2004 Kokubo et al. ................ 75/252
2004/0184219 A1* 9/2004 Otsuka et al. ............ 361/306.3
2007/0035030 A1* 2/2007 Horton et al. ............... 257/773

FOREIGN PATENT DOCUMENTS

| JP | 6-224257 | 8/1994 |
| JP | 8-70079 A | 3/1996 |
| JP | 9-102432 | 4/1997 |
| JP | 2001-85606 A | 3/2001 |
| JP | 2002-353275 | 12/2002 |
| JP | 2004-95804 | 3/2004 |
| JP | 2004-214699 | 7/2004 |
| JP | 2005-45000 | 2/2005 |

OTHER PUBLICATIONS

Japanese Office Action dated Nov. 6, 2007 with Partial English Translation.
Japanese Office Action dated Feb. 10, 2009 with partial English-Language Translation.

* cited by examiner

*Primary Examiner*—N Drew Richards
*Assistant Examiner*—Paul E Patton
(74) *Attorney, Agent, or Firm*—McGinn IP Law Group, PLLC

(57) ABSTRACT

A connecting structure between a circuit and another electronic component, includes a first electrode and a second electrode, and a dielectric material interposed between the first and second electrodes.

19 Claims, 7 Drawing Sheets

CONNECTING STRUCTURE, PRINTED SUBSTRATE, CIRCUIT, CIRCUIT PACKAGE AND METHOD OF FORMING CONNECTING STRUCTURE

BACKGROUND OF THE INVENTION

The present invention relates to a connecting structure, a printed substrate, a circuit, a circuit package and a method of forming a connecting structure. For example, the present invention relates to an electric circuit (e.g., an LSI (Large scale integrated circuit)) and a printed substrate (e.g., circuit substrate) and it relates to an electric circuit package (e.g., an LSI and a circuit substrate). For example, the present invention may be used suitably for portable electronic equipment (e.g., a mobile telephone which uses a battery as a power source and which is required for reducing power consumption).

When mounting an electric circuit (e.g., LSI) on a circuit substrate (or semiconductor chip) provided with surface electrodes for inputting/outputting signals, a wire bonding connection has been utilized. In this case, for example, since the length of the wire bonding is long, a problem may arise that the inductance, etc. may increase, thereby deteriorating RLC characteristics and making it difficult to input/output signals at high speed. Therefore, connection by a chip-on-board (or chip-on-chip) system of a flip-chip connection for an electric circuit (e.g., LSI) and a circuit substrate (or semiconductor chip) by way of bumps (protruded electrodes) has been utilized recently.

Electric circuits (e.g., LSIs) adopting a connection by the chip-on-board system of this type include, for example, those as shown in FIG. 7 of the related art.

As shown in FIG. 7, electric circuit (e.g., LSI 1) 1 has a plurality of layers or pads (surface electrodes) 2, . . . , 2 for inputting/outputting signals disposed at predetermined positions, and has solder bumps 5, . . . , 5 for flip-chip connection to a printed substrate 4 having a plurality of pads (surface electrodes) 3, . . . , 3 for inputting/outputting signals at the positions corresponding to pads 2, . . . , 2. In this case, pads 2, . . . , 2 and pads 3, . . . 3 are formed, for example, each into a circular post of 1 mm diameter, and the distance between pads 2, . . . , 2 and pads 3, . . . , 3 (that is, a height for solder bump 5) is set to 10 µm. Further, solder bumps 5, . . . , 5 each have a substantially spherical shape.

FIG. 8 is an exemplary circuit diagram showing the electrical constitution of a main portion of the printed substrate 4 connected by flip-chip connection with electric circuit 1 (e.g., LSI 1) in FIG. 7.

In printed substrate 4, as shown in FIG. 8, one of the terminals of capacitive part 12 and one of the terminals of resistive part 13 are connected by transmission channel (pattern) 11 to pad 3, and the other of the terminals of capacitive part 12 and the other of the terminals of resistive part 13 are connected to ground (GND). Transmission channel 11 has, for example, a characteristic impedance of 100Ω, a transmission delay time of 7.5 ns/m, and a wire length of 50 cm. Further, the capacitance of capacitive part 12 is 20 pF and the resistance value of resistive part 13 is 100Ω.

FIG. 9 is an exemplary graph showing an exemplary embodiment of a measured value for a consumption current of an output buffer (not illustrated) used as an interface on an output side of electric circuit 1 (e.g., LSI 1) in FIG. 8 in which a current value is expressed on the ordinate and time is expressed on the abscissa.

As shown in FIG. 9, for example, the current value is −12 mA as the minimum value and 19.5 mA as the maximum value, and the difference between them is 31.5 mA.

In addition to the electric circuit (e.g., LSI) described above, the techniques of this type include, for example, those as described in the following document.

That is, bypass capacitor described in JP-A No. 102432/1997 includes a dielectric material interposed between grid array type electronic parts and a printed substrate, and connected with the power source electrode and the grounded electrode. Accordingly, inductance relative to the electronic part is eliminated, thereby to make the power supply to the electronic part efficient. Further, the electronic part and the printed substrate are connected by way of an electrode for mounting to the substrate.

SUMMARY OF THE INVENTION

However, the electric circuit (e.g., LSI) described above has many problems.

For example, in the electric circuit (e.g., LSI) of FIG. 7, the difference between the minimum value and the maximum value of the consumed current may be relatively large (i.e., 31.5 mA in the example above). Accordingly, it may be difficult to reduce the power consumption and thus the battery life may be short when using the electric circuit (e.g., LSI) for portable electronic equipment such as a mobile telephone. Further, since the power consumption may be large, an exemplary problem may arise that minimizing or dissipating heat generation also may be complicated.

In the bypass capacitor described in JP-A No. 102432/1997, the electronic part and the printed substrate are connected by the electrode for mounting to the substrate to ensure the conductivity of the electrode for mounting to the substrate. Further, the dielectric material is connected with the power source electrode and the grounded electrode. Therefore, the structure and aim of JP-A No. 102432/1997 are different from those of the present invention and the problems described above are not improved.

In view of the foregoing and other exemplary problems, drawbacks, and disadvantages of the conventional techniques, it is an exemplary feature of the present invention to provide a connecting structure between an electric circuit and another electronic component, a circuit (e.g., LSI) and a printed substrate, a circuit package having reduced power consumption, having long battery life even when, for example, using portable equipment such as a mobile telephone, and facilitating counter measure(s) for heat generation.

The present invention provides a connecting structure between a circuit and another electronic component, including a first electrode and a second electrode, and a dielectric material interposed between the first and second electrodes.

The present invention also provides a printed substrate, including the connecting structure above.

The present invention also provides a circuit, including the connecting Structure above.

The present invention also provides a circuit package, including a circuit that includes the first electrode above, a printed substrate that includes the second electrode above, and the dielectric material above.

The present invention also provides a connecting structure between a circuit and another electronic component, including a first electrode and a second electrode, and means for allowing indirect current flow between the first and second electrodes.

The present invention also provides a method of forming a connecting structure, including interposing a dielectric material between the first and second electrodes.

According to the present invention, since a connecting structure between a circuit and another electronic component includes a first electrode, a second electrode and a dielectric material interposed between the first and second electrodes, a current corresponding to signals inputted/outputted between the circuit and the electronic component may not flow directly. Instead, current may flow indirectly so that the power consumption may be decreased.

BRIEF DESCRIPTION OF THE DRAWINGS

The novel and exemplary features believed characteristic of the invention are set forth in the appended claims. The invention itself, however, as well as other exemplary features and advantages thereof, will be best understood by reference to the detailed description which follows, read in conjunction with the accompanying drawings, wherein:

DETAILED DESCRIPTION OF THE EXEMPLARY EMBODIMENTS

An electric circuit (e.g., LSI) having bumps for flip-chip connection to a printed substrate in which the bumps are formed of a dielectric material and a circuit substrate in which an internal electrode is disposed to an inner layer portion, are provided.

First Exemplary Embodiment

Figure 1:
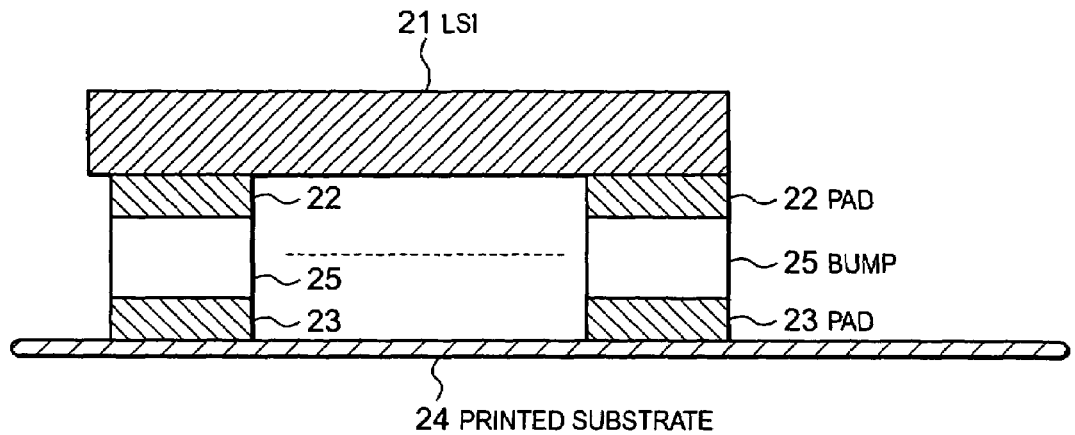
FIG. 1 is an exemplary view showing a constitution of a portion of an electric circuit (e.g., LSI 21) as a first exemplary embodiment of the invention.

FIG. 1 is a view showing an exemplary constitution of a portion of a circuit substrate to which an electric circuit (e.g., LSI 21), as a first exemplary embodiment of the invention, is mounted.

The electric circuit (e.g., LSI 21) of this exemplary embodiment, as shown in FIG. 1, includes a plurality of layers pads (e.g., upper electrodes) 22, . . . , 22 for inputting/outputting signals disposed at predetermined positions, and bumps 25, . . . , 25 for flip-chip connection to a printed substrate 24 in which a plurality of layers or pads (e.g., lower electrodes) 23, . . . , 23 for inputting/outputting signals are disposed at positions corresponding to pads 22, . . . 22.

In this case, pads 22, . . . , 22, and pads 23, . . . , 23 are formed, for example, each as a substantially circular post of substantially 1 mm diameter and such that a distance between pads 22, . . . , 22 and pads 23, . . . , 23 (that is height for bumps 25, . . . , 25) is set to substantially 10 μm. Further, bumps 25, . . . , 25 each have a substantially circular post shape. Of course, the invention is not limited to these exemplary dimensions and shapes of the pads and bumps.

Bumps 25, . . . , 25 are formed of a dielectric material for constituting a capacitor being interposed between pads 22, . . . 22 and pads 23, . . . , 23. For the dielectric material, polyimids (and polyimids increased with impurities) and thin film ceramics may be used, for example and a specific dielectric constant may be, for example, substantially equal to or greater than 4, and more preferably within a range of about 4 to about 20, and most preferably about 15-20. When connecting the electric circuit (e.g., LSI 21) to printed substrate 24, this may be performed, for example, by reflow at a predetermined temperature condition.

In the electric circuit (e.g., LSI 21), signals are inputted/outputted by way of the capacitor constituted with pads 22, . . . , 22, bumps 25, . . . , 25, and pads 23, . . . , 23. Further, the power source for the electric circuit (e.g., LSI 21) is adapted to be Supplied from a power feed line (not illustrated).

Figure 2:
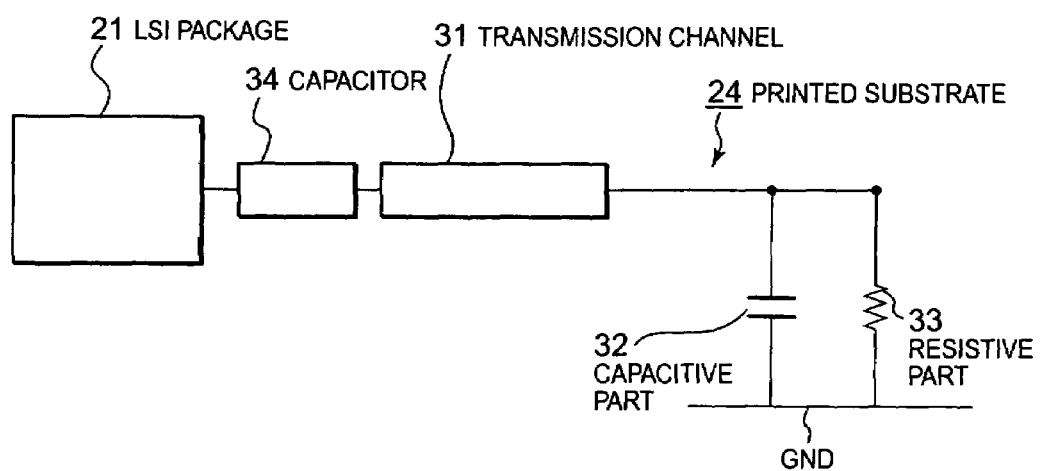
FIG. 2 is an exemplary circuit diagram showing an electrical constitution of a portion of printed substrate 24 to which the electric circuit (e.g., LSI 21) in FIG. 1 is connected (e.g., flip-chip connected)

FIG. 2 is an exemplary circuit diagram showing an exemplary electrical constitution of a portion of printed substrate 24 connected (e.g., flip-chip connected) with the electric circuit (e.g., LSI 21) in FIG. 1.

In printed substrate 24, as shown in FIG. 2, one of the terminals of capacitive part 32 and one of the terminals of resistive part 33 are connected by transmission channel (pattern) 31 to capacitor 34 (formed by pad 22, bump 25 and pad 25 shown in FIG. 1), and the other of the terminals of capacitive part 32 and the other of the terminals of resistive part 33 are connected to ground (GND). Transmission channel 31 may have, for example, a characteristic impedance of $100\Omega$, a transmission delay time of 7.5 ns/m and a wire length of 50 cm. Further, a capacitance of capacitive part 32 may be 20 pF and the resistance value of resistive part 33 may be $100\Omega$.

Figure 3:
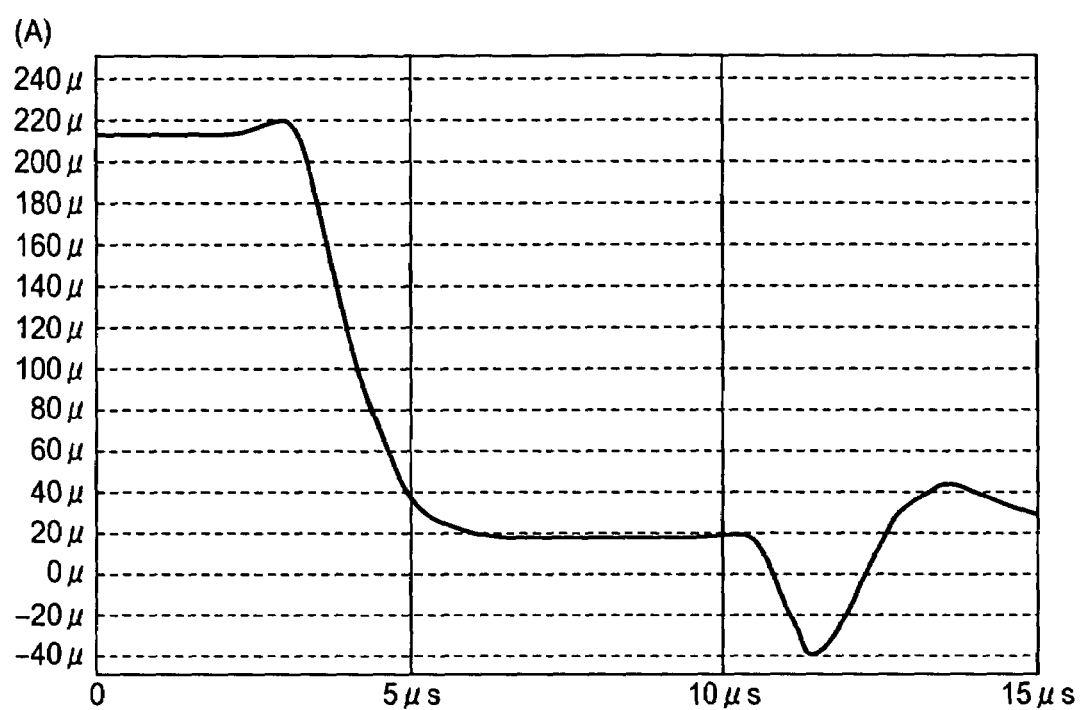
FIG. 3 is an exemplary view showing an exemplary embodiment of measured values for a consumption current of an output buffer used as an interface on an output side of the electric circuit (e.g., LSI 21) in FIG. 2.

FIG. 3 is an exemplary graph showing an example of a measured value for a consumption current of an output buffer (not illustrated) used as an interface on an output side of the electric circuit (e.g., LSI 21) in FIG. 2, in which a current value is expressed on the ordinate and time is expressed on the abscissa.

Figure 7:
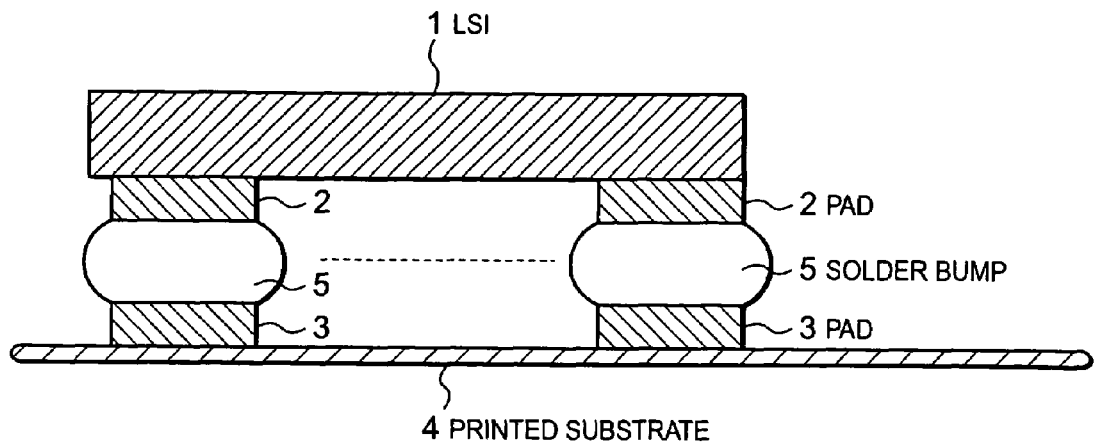
FIG. 7 is an exemplary view showing the constitution of a portion of a related art electric circuit (e.g., LSI 1)
Figure 8:
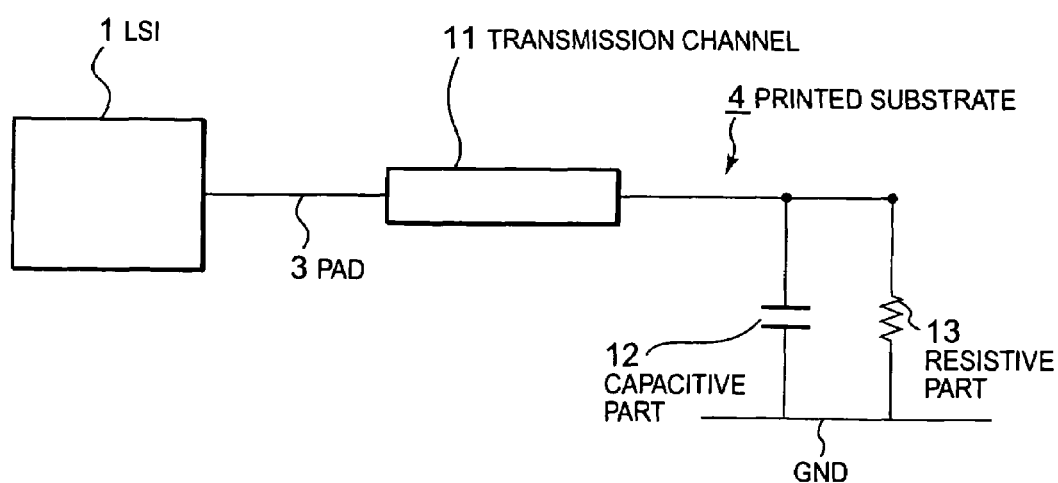
FIG. 8 is an exemplary circuit diagram showing an electrical constitution of a portion of printed substrate 4 to which electric circuit 1 (e.g., LSI 1) in FIG. 7 is connected (e.g., flip-chip connected)
Figure 9:
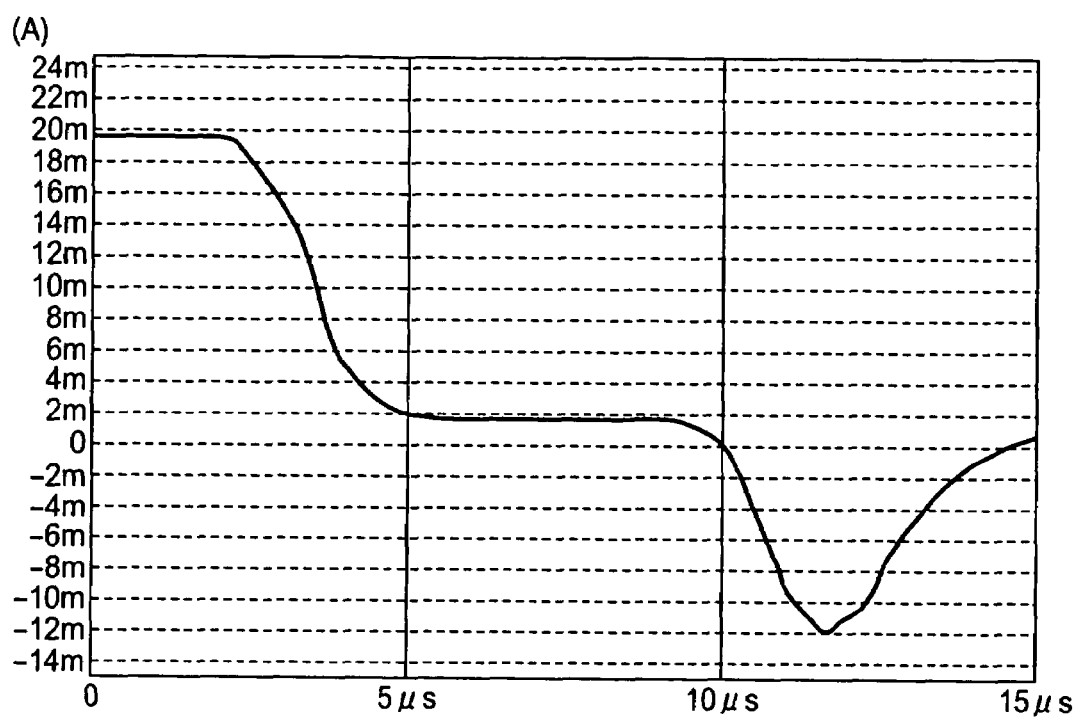
FIG. 9 is an exemplary view showing an exemplary embodiment of measured values for a consumption current of an output buffer used as an interface on a output side of electric circuit 1 (e.g., LSI 1) in FIG. 8.

As shown in FIG. 3, an exemplary current value is −40 μA as the minimum value and 220 μA as the maximum value, and the difference between them is 0.26 mA. When comparing the current difference shown in FIG. 3 with the current difference of the related art electric circuit (e.g., LSI 1) (31.5 mA shown in FIG. 9), it is 1/121 of the current amount of the circuit of FIG. 7, thereby attaining a significant reduction of power. That is, while current, corresponding to the signals inputted and outputted between the related art electric circuit (e.g., LSI 1) and printed substrate 4 directly flows by way of the solder bump 5 in the related art structure of FIG. 7 in the present invention, since the current, corresponding to signals inputted/outputted between the electric circuit (e.g., LSI 21) and printed substrate 24, may not flow directly by way of bump 25 in this exemplary embodiment, the power consumption may be decreased.

As described above, in this first exemplary embodiment, since bumps 25, ..., 25 of the dielectric material are formed between pads 22, ..., 22 and pads 23, ..., 23, to constitute the capacitor, for example, the current may not flow directly between the electric circuit (e.g., LSI 21) and printed substrate 24, and the power consumption may be decreased. Accordingly, for example, when using the electric circuit (e.g., LSI 21) for portable electronic equipment such as a mobile telephone, the battery life thereof may be extended. Further, since this configuration may generate less heat, counter measures for heat dissipation may also be facilitated and simplified.

Second Exemplary Embodiment

Figure 4B:
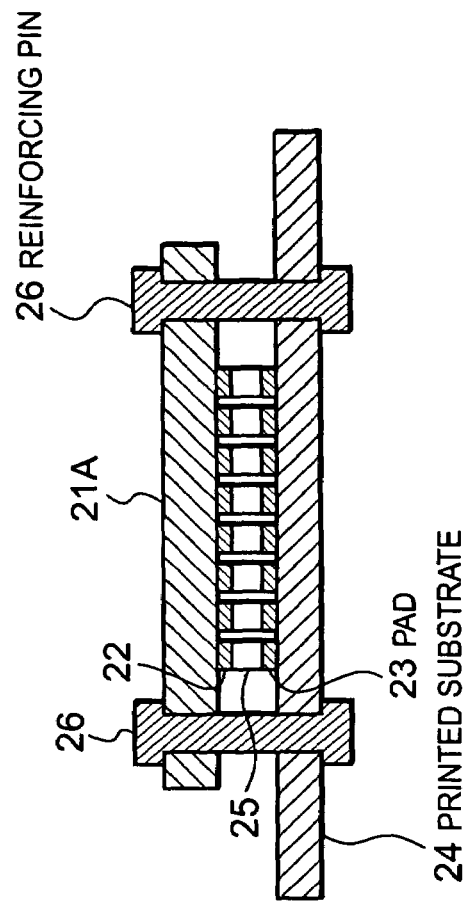
FIGS. 4A and 4B are exemplary plane and side cross-sectional views showing a constitution of a portion of an electric circuit (e.g., LSI 21A) as a second exemplary embodiment of the invention.
Figure 4A:
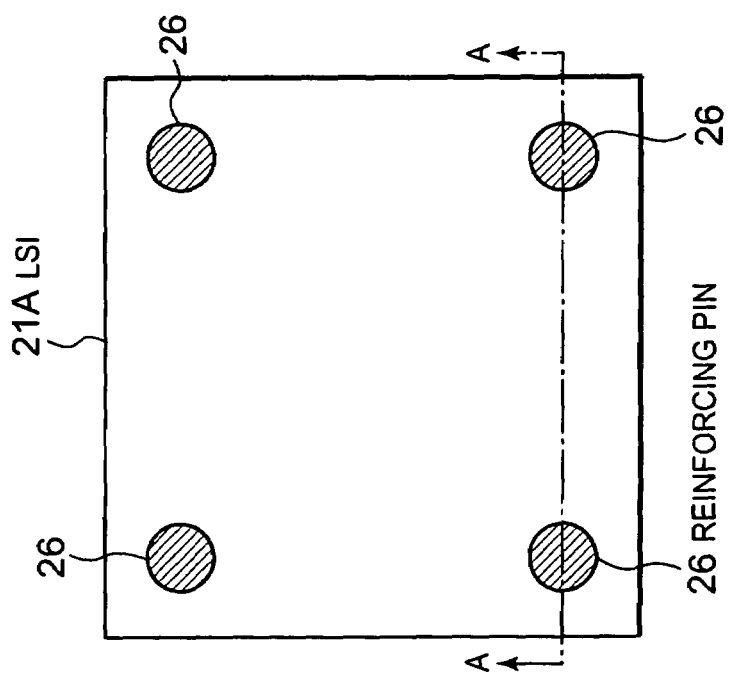

FIGS. 4A and 4B are exemplary views showing the constitution of a portion of an electric circuit (e.g., LSI 21A) as a second exemplary embodiment of the invention in which elements in common with those in FIG. 1 showing the first exemplary embodiment use common reference numerals. FIG. 4A is a plane view and FIG. 4B is a cross-sectional view taken along line A-A in FIG. 4A.

In the electric circuit (e.g., LSI 21A) of this exemplary embodiment, reinforcing pins 26, ..., 26 for connecting and supporting printed substrate 24 are disposed in a region other than the region where pads 22, ..., 22 are disposed, as shown in FIGS. 4A and 4B. The material for reinforcing pins 26, ..., 26 may be any material so long as the pins can reliably support printed substrate 24. In the electric circuit (e.g., LSI 21A), since printed substrate 24 is supported reliably by reinforcing pins 26, ..., 26, reliability for the connection state of printed substrate 24 may be improved.

Third Exemplary Embodiment

Figure 5:
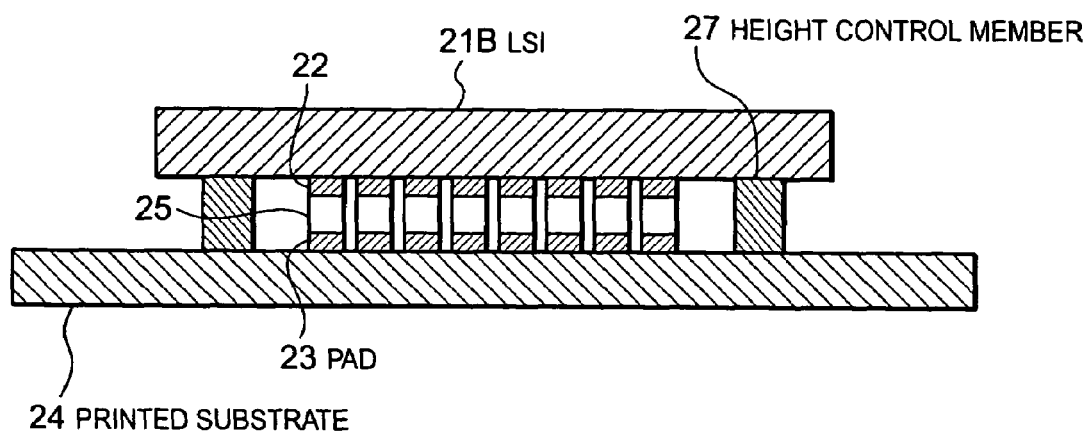
FIG. 5 is an exemplary view showing a constitution of a portion of an electric circuit (e.g., LSI 21B) as a third exemplary embodiment of the invention.

FIG. 5 is an exemplary view showing a constitution of a portion of an electric circuit (e.g., LSI 21B) as a third exemplary embodiment of the invention.

In the electric circuit (e.g., LSI 21B) of this exemplary embodiment, as shown in FIG. 5, height control member 27 for connecting printed substrate 24 and controlling the height relative to printed substrate 24, is disposed in a region other than the region where pads 22, ..., 22 are disposed. In the electric circuit (e.g., LSI 21B), since the height relative to the printed substrate 24 is controlled by height control member 27, when it is necessary to control the height for pads 22, ..., 22 and bumps 25, ..., 25 or pads 23, ..., 23, this may be easily coped with.

Fourth, Fifth and Sixth Exemplary Embodiments

Figure 6A:
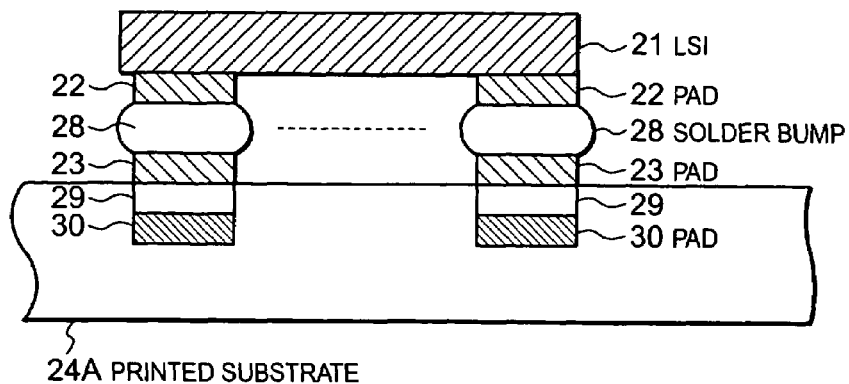
FIGS. 6A-6C are exemplary cross-sectional views showing a constitution of a portion of a circuit substrate as fourth through sixth exemplary embodiments of the invention, respectively.

FIG. 6A is a view showing a constitution of a portion of a circuit substrate as a fourth exemplary embodiment of the invention.

As shown in FIG. 6A, the circuit substrate of this exemplary embodiment includes printed substrate 24A, in which a plurality of pads (surface electrodes) 23, ..., 23 for inputting/outputting signals may be disposed at predetermined positions, and a plurality of pads (internal electrodes) 30, ..., 30 may be disposed at an inner layer portion of substrate 24A for constituting a capacitor by interposing the dielectric materials 29, ..., 29 between pad 23 and pad 30. Pads 30, ..., 30 are connected with a pattern (not illustrated). Further, pads 23, ..., 23 are connected by way of solder bumps 28, ..., 28 and pads 22, ..., 22 to an electric circuit (e.g., LSI 21).

Figure 6B:
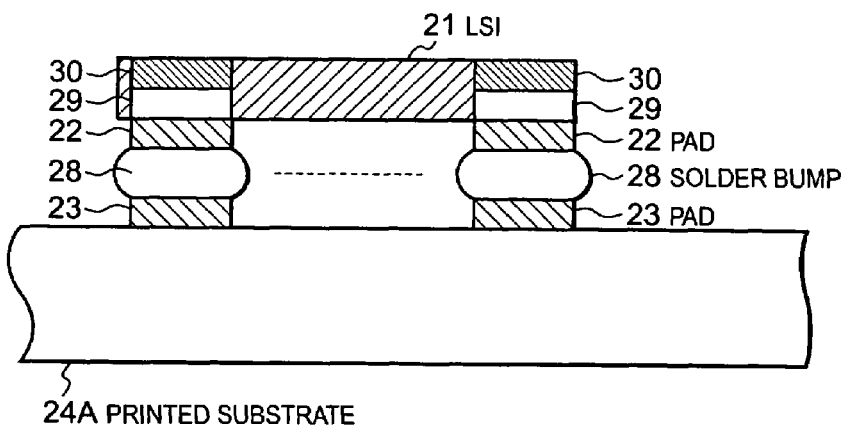
Figure 6C:
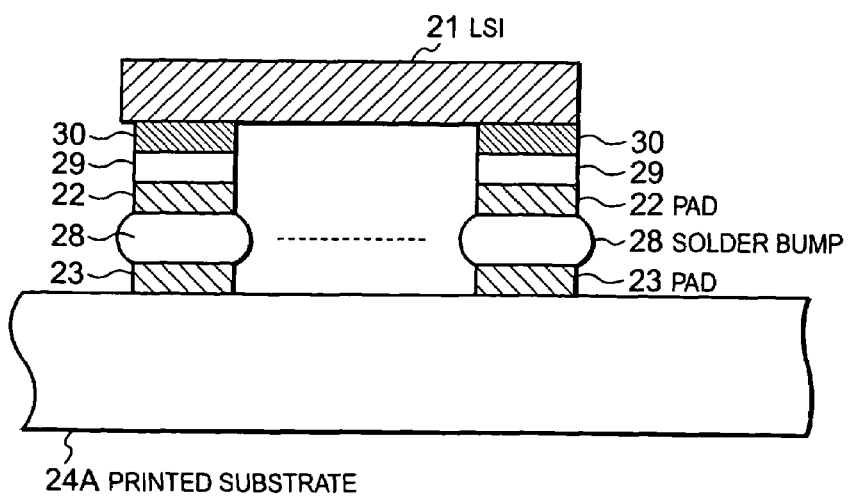

FIG. 6B and FIG. 6C are other exemplary views showing a constitution of a portion of a circuit substrate as fifth and sixth exemplary embodiments of the present invention. As shown in FIG. 6B, a circuit (e.g., LSI 21) may include a first electrode (e.g., pad 30) and a dielectric material (e.g., bump 29) in (e.g., embedded in) an inner layer portion of a circuit (e.g., LSI 21). As shown in FIG. 6C, the circuit (e.g., LSI 21) includes the first electrode (e.g., pad 30) and the dielectric material (e.g., bump 29) formed outside (externally) of the circuit (e.g., LSI 21).

In printed substrate 24A, signals are inputted/outputted relative to the electric circuit (e.g., LSI 21) by way of the capacitor comprising pads 23, ..., 23, dielectric materials 29, ..., 29 and pads 30, ..., 30. With this constitution, since the current corresponding to signals inputted/outputted between the electric circuit (e.g., LSI 21) and printed substrate 24A may not flow directly, the power consumption may be decreased.

While this invention has been described with reference to exemplary embodiments, this description is not intended as limiting. Various modifications of the illustrative embodiments, as well as other embodiments of the invention, will be apparent to persons skilled in the art upon taking description as a whole. It is, therefore, contemplated that the appended claims will cover any such modifications or embodiments as fall within the true scope of the invention.

For example, a shape of pad 22 is not restricted to the circular post shape, but may be a shape of a polygonal post in accordance with the pattern on printed substrate 24. Further the material of pad 22 and pad 23 may be electric conductive material (e.g., metal, polysilicon, etc).

Further, in the first to the third exemplary embodiments described above, while electric circuits (e.g., LSI 21, 21A, or 21B) may be connected by the chip-on-board system to printed substrate 24, substantially the same function and the effect as those in the exemplary embodiments described above may be obtained by also disposing a semiconductor chip, instead of printed substrate 24, and connecting them by the chip-on-chip system.

Further, bump 25 formed of the dielectric material may be used also in a case of constituting, for example, an SIP (system-in-package) by connecting a plurality of semiconductor chips in a three-dimensional manner.

Further, as the dielectric material forming bump 25, tantalum oxide ($Ta_2O_5$), barium titanate ($BaTiO_3$), PZT ($PbZrO_3$-$PbTiO_3$), silicon oxyfluoride ($SiO_xF_y$), Polyimide, FR4 (Flame Resistant 4 Glass Epoxy, designated FR-4 by NEMA, is a woven glass cloth construction laminate with an epoxy resin binder. (an 8 ply construction in 0.059" thickness.) This material is generally used in communications, computer, computer peripherals, instruments, industrial controls, and automotive electronics. It offers advantages in the following areas: Electrical Properties—Excellent for high technology communications and computer systems.), and FR5 (Flame Resistant 5, FR5 Glass Reinforced Epoxy, this grade is similar to FR4, with the addition of a higher operating temperature and some improved mechanical strength at elevated temperatures.) etc. may also be used for example.

Further, while bump 25 in the first to third and sixth exemplary embodiments is formed entirely of the dielectric material, solder bumps may optionally be present in admixture. In this case, for connection of the electric circuit (e.g., LSI 21) to printed substrate 24, an ultrasonic system using ultrasonic waves for forming the connection, etc. may also be used, for example, in addition to reflow.

Further, while bumps 25 are formed on the side of the electric circuit (e.g., LSI 21) before connection of the electric circuit (e.g., LSI 21) to printed substrate 24, substantially the same function and the effect as those in the previous exemplary embodiments may be obtained also by forming bumps 25, not on the side of the electric circuit (e.g., LSI 21), but by forming them on the side of printed substrate 24.

The present invention may be applicable generally to connection (e.g., flip-chip connection) of a semiconductor chip. Further, the present invention is especially advantageous when applied to portable electronic equipment such as a mobile telephone or a portable information terminal for which decreased power consumption power is desirable.

Further, the inventor's intent is to encompass all equivalents of all the elements of the claimed invention even if the claims are amended during prosecution.

This application is based on Japanese Patent Application No. 2005-171210 filed on Jun. 10, 2005 and including specification, claims, drawings and summary. The disclosure of the above Japanese Patent Application is incorporated herein by reference in its entirety.

What is claimed is:

1. A connecting structure between a circuit and another electronic component, comprising:
   a first electrode provided on said circuit;
   a second electrode provided on said electronic component, said second electrode comprising an input/output end of said electronic component;
   wherein said first electrode is located at a substantially overlapped position with respect to said second electrode, so that said circuit and said electronic component are electrically connected with each other without an intervening wiring therebetween; and
   a dielectric material interposed between and directly connected to said first and second electrodes.

2. The connecting structure according to claim 1, wherein a signal is inputted/outputted via said first and second electrodes and said dielectric material.

3. The connecting structure according to claim 2, wherein said signal includes an information-carrying signal.

4. The connecting structure according to claim 1, said dielectric material comprising:
   one of tantalum oxide, barium titanate, PZT, silicon oxyfluoride, Polyimide, FR4 (Flame Resistant 4) and FR5 (Flame Resistant 5).

5. The connecting structure according to claim 1, wherein:
   a dielectric constant of said dielectric material is substantially greater than 4;
   a diameter of said first and second electrodes is substantially 1 mm; and a distance between said first and second electrodes is substantially 10 μm.

6. A printed substrate, comprising:
   said connecting structure of claim 1.

7. A circuit, comprising:
   said connecting structure of claim 1.

8. A circuit package, comprising:
   a circuit that includes said first electrode of claim 1;
   a printed substrate that includes said second electrode of claim 1; and
   said dielectric material of claim 1.

9. The circuit package according to claim 8, wherein said printed substrate includes said second electrode and said dielectric material of said connecting structure in an inner layer portion of said printed substrate.

10. The circuit package according to claim 8, wherein said circuit includes said first electrode and said dielectric material of said connecting structure formed in an inner layer portion of said circuit.

11. The circuit package according to claim 8, wherein said circuit includes said first electrode and said dielectric material of said connecting structure, formed externally of said circuit.

12. The circuit package according to claim 8, further comprising:
    a reinforcing member that reinforces a connection between said circuit and said printed substrate.

13. The circuit package according to claim 12, wherein said reinforcing member is disposed in a region other than a region in which said first electrode is disposed.

14. The circuit package according to claim 8, further comprising:
    a height control member that controls a distance between said circuit and said printed substrate.

15. The circuit package according to claim 14, wherein said height control member is disposed in a region other than a region in which said first electrode is disposed.

16. The circuit package according to claim 8, wherein a connection between said circuit and said printed substrate includes a flip-chip connection.

17. A method of forming a connecting structure, comprising:
    providing a first electrode on a circuit;
    providing a second electrode on an electronic component, said second electrode comprising an input/output end of said electronic component, and said second electrode being located at a substantially overlapped position with respect to said first electrode, so that said circuit and said electronic component are electrically connected with each other without an intervening wiring therebetween;
    interposing a dielectric material between said first electrode and said second electrode; and
    connecting said dielectric material directly to said first and second electrodes.

18. The method according to claim 17, said dielectric material comprising:
    one of tantalum oxide, barium titanate, PZT, silicon oxyfluoride, Polyimide, FR4 (Flame Resistant 4) and FR5 (Flame Resistant 5).

19. The method according to claim 17, wherein said dielectric material forms a capacitor for allowing indirect current flow between said first and second electrodes.

* * * * *